(12) United States Patent
Chih-Hui (10) Patent No.: US 6,952,111 B1
(45) Date of Patent: Oct. 4, 2005

(54) APPARATUS AND METHOD FOR UNIVERSALLY TESTING SEMICONDUCTOR DEVICES WITH DIFFERENT PIN ARRANGEMENT

(75) Inventor: Yeh Chih-Hui, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/949,338

(22) Filed: Sep. 27, 2004

(30) Foreign Application Priority Data

Mar. 31, 2004 (TW) .............................. 93108826 A (51) Int. Cl.[7] .......................................... G01R 31/02
(52) U.S. Cl. ..................................... 324/761; 324/765
(58) Field of Search .............................. 324/73.1, 761, 324/763–765, 158.1; 714/724–725, 733–734

(56) References Cited

U.S. PATENT DOCUMENTS

| 6,087,843 A | * | 7/2000 | Pun et al. ..................... 324/765 |
| 6,339,338 B1 | * | 1/2002 | Eldridge et al. ............ 324/765 |
| 6,356,096 B2 | * | 3/2002 | Takagi et al. ................ 324/765 |
| 6,771,087 B1 | * | 8/2004 | Oz et al. ..................... 324/763 |

* cited by examiner

*Primary Examiner*—Minh N. Tang
(74) *Attorney, Agent, or Firm*—Michael Bednarek; Pillsbury Winthrop Shaw Pittman LLP (57) ABSTRACT

An apparatus for testing a semiconductor device is disclosed. According to the present invention, the apparatus includes a pair of input pins, a first conductive wire, a second conductive wire, a driver and a terminator. A device-under-test (DUT) is connected to one of the pair of input pins. The first conductive wire and the second conductive wire are connected in parallel between the pair of input pins. The driver is coupled to the first conductive wire via a third conductive wire, and the terminator is coupled to the second conductive wire via a fourth conductive wire.

17 Claims, 7 Drawing Sheets

APPARATUS AND METHOD FOR UNIVERSALLY TESTING SEMICONDUCTOR DEVICES WITH DIFFERENT PIN ARRANGEMENT

BACKGROUND OF THE INVENTION (a) Field of the Invention

The invention relates to an apparatus and a method for testing a high-speed semiconductor device.

(b) Description of the Prior Art

Double Data Rate (DDR) Synchronous Dynamic Random Access Memory (SDRAM) is a memory technique developed based upon SDRAM. Unlike SDRAM that is capable of only supporting one data operation during each clock period, DDR SDRAM has capability of executing two data operations during each clock period. Therefore, not only bandwidth of memory is doubled but also data transmission capacity is multiplied. For the aforesaid advantage, DDR SDRAM is extensively applied in computer system platforms including personal computers, workstations, servers, laptop computers, portable devices, computer networks, and communication products, and consequently stands as a mainstream product in memory techniques. Along with technique advancement, data rate of DDR SDRAM has increased from 200/266 MHz to 533/667 MHz, and can promisingly be further increased to 800 MHz/1.066 GHz. It is to be noted that frequency upgrading is also an arduous challenge for testing techniques.

Figure 1:
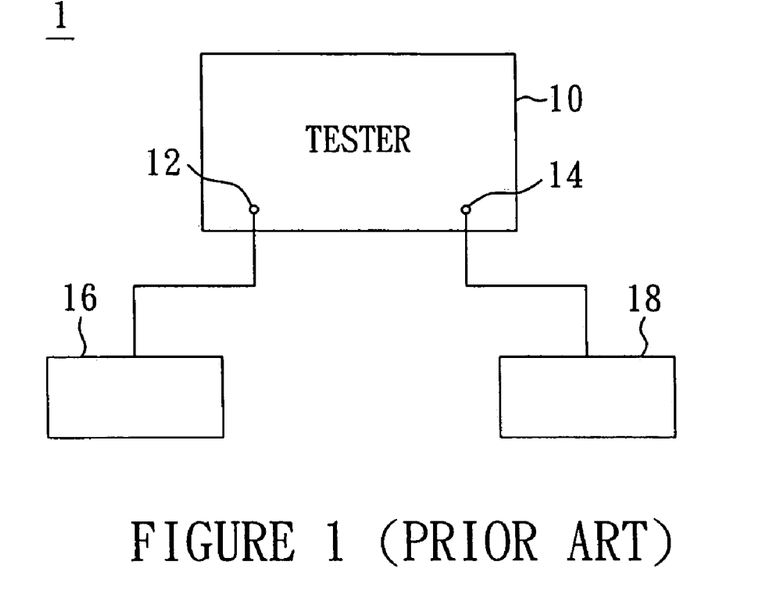
FIG. 1 shows a schematic view of a test system 1 applied for DDR SDRAM.

Referring to FIG. 1 showing a test system 1 applied in DDR SDRAM, the test system 1 comprises a tester 10 that may be an Advantest 5592/5593 tester manufactured by Advantest Corporation and is mainly for generating test patterns. The tester 10 is divided into several stations, and has two stations 12 and 14 supposed an Advantest 5592/5593 tester is adopted. The stations 12 and 14 are connected to respective test fixtures 16 and 18 as shown in FIG. 1.

Figure 2:
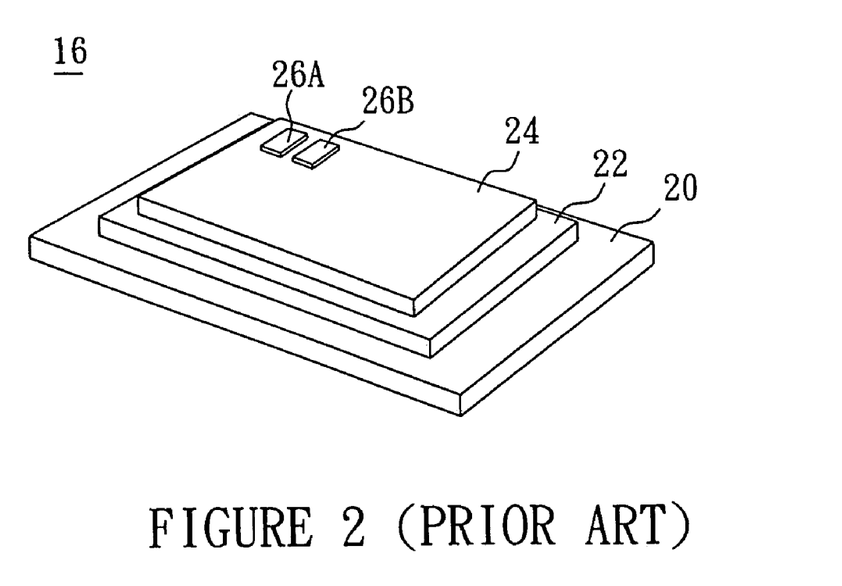
FIG. 2 shows a schematic view of a test fixture in FIG. 1.

Referring to FIG. 2 showing a schematic view of the test fixture 16, the test fixture 16 has a test head 20, a common motherboard 22 and a socket board 24. The test head 20 is devised with elements including a driver and a comparator therein for driving and comparing signals. The common motherboard 22 has a coaxial cable therein for connecting the common motherboard 22 to the socket board 24. The socket board 24 has a socket board printed circuit board (PCB) and a socket connector for fastening an integrated circuit (IC). The device-under-test (DUT) is inserted to the socket board 24. To simplify illustrations, only two DUTs 26A and 26B are shown in FIG. 2. In practical, supposed an Advantest 5592/5593 tester is used, a number of DUTs may be 64 or even 128. For that FIG. 2 serves for illustration purposes only, the test head 20 is electrically coupled to the common motherboard 22, and the common motherboard 22 is electrically coupled to the socket board 24.

Figure 3:
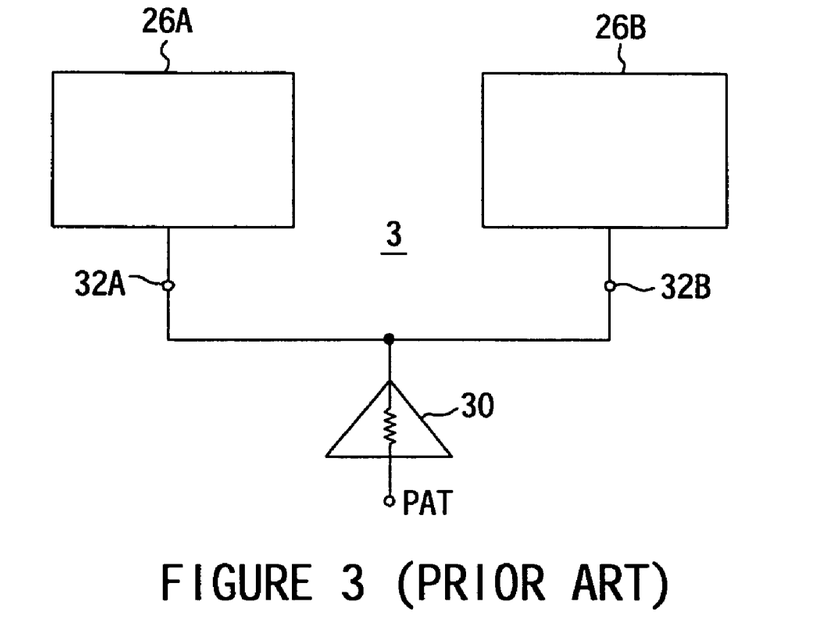
FIG. 3 shows a circuit schematic diagram of a conventional test apparatus applied to an input end.

Pins of each of the DUTs 26A and 26B are generally divided into input pins and input/output (I/O) pins. Referring to FIG. 3 showing a circuit schematic diagram of a conventional test apparatus 3 applied to an input pin. The conventional test apparatus 3 applied to an input pin is disposed in the test fixture 16 shown in FIG. 2. The test apparatus 3 comprises a driver 30 connected to one input end of the DUT 26A through a pin 32A whereas another pin 32B is connected to one input end of the DUT 26B. In other words, the DUTs 26A and 26B are both driven and controlled by the driver 30.

Figure 4:
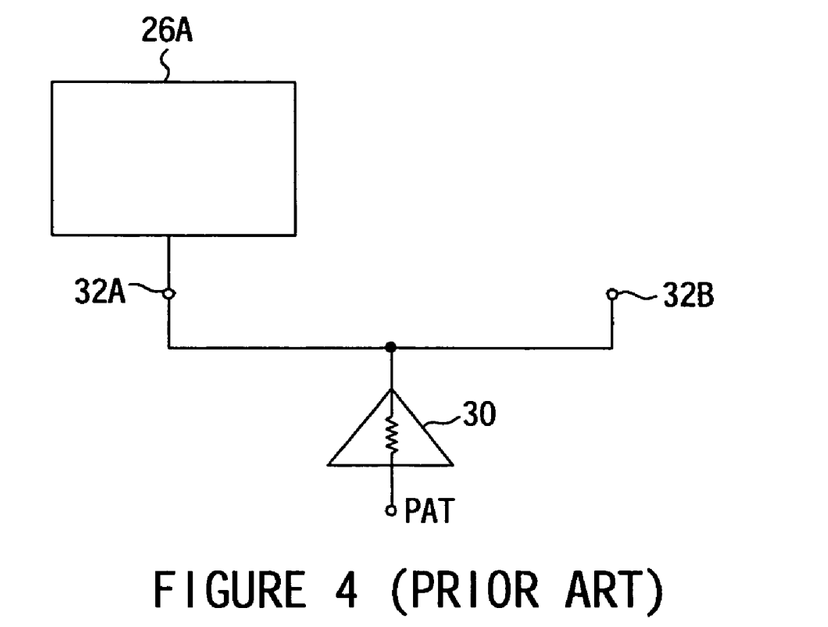
FIG. 4 shows a pin in FIG. 3 being left floating.

It is to be noted that I/O end of DDR SDRAM are differentiated in 4-bit, 8-bit and 16-bit. Connection configuration in FIG. 3 is suitable for testing 4-bit I/O and 8-bit I/O DDR SDRAM but not 16-bit I/O DDR SDRAM. For 16-bit applications, it is necessary that the pin 32B be left floating as shown in FIG. 4. To be more precise, the driver 30 is merely capable of corresponding to one DUT 26A. At this point, impedance of the floating pin 32B is rather great that apparent reflection of signals transmitted by the driver 30 is produced to affect accuracy of test results. Reflection becomes even more severe as signal frequencies get greater.

Figure 5:
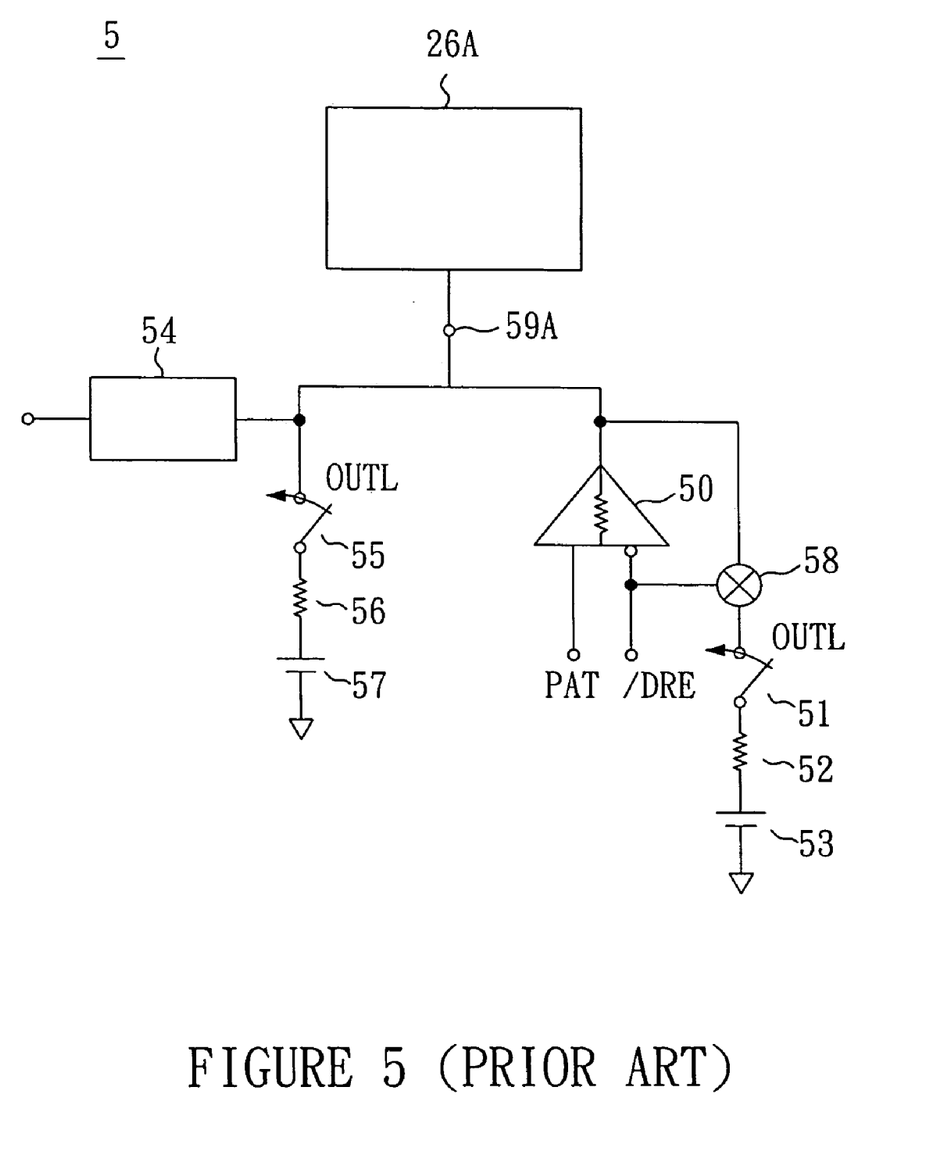
FIG. 5 shows circuit schematic diagram of a conventional test apparatus applied to an I/O end.

Referring to FIG. 5 showing a circuit schematic diagram of a prior test apparatus 5 applied to an I/O end. The prior test apparatus 5 applied to an I/O end is disposed in the test fixture 16 in FIG. 2. The test apparatus 5 comprises a driver 50, a switch 51, a resistor 52, a voltage terminal 53, a comparator 54, a switch 55, a resistor 56 and a voltage terminal 57. An input of the driver 50 is for receiving a test pattern PAT, and an output end thereof is connected to the DUT 26A via an I/O pin 59A. In other words, the driver 50 is for merely corresponding to one DUT 26A. The switch 51, the resistor 52 and the voltage terminal 53 are connected in series between a driver enable signal (/DRE) and ground. The comparator 54 is connected to the I/O pin 59A. When data are read from the I/O pin 59A, the comparator 54 determines whether the data are at logic high or logic low. The switch 55, the resistor 56 and the voltage terminal 57 are connected in series between the comparator 54 and ground. Under a write mode, the switches 51 and 55 are turned off through control of an OUTL signal, and the enable signal /DRE is at logic low for enabling the driver 50, such that the output end of the driver outputs the test pattern signal PAT, with the enable signal /DRE simultaneously disabling the switch 58. Under a read mode, the switches 51 and 55 are turned on through control of an OUTL signal, and the enable signal /DRE is at logic high for disabling the driver 50 and enabling the switch 58, such that the resistor 52 and the voltage terminal 53 are coupled to the I/O pin 59A. The read data whether being logic high or logic low is determined by the comparator 54. Likewise, the test apparatus applied to the DUT 26B operates in an identical or similar method as that disclosed in FIG. 5. To be more accurate, the DUTs 26A and 26B cannot share a same driver. There are test fixtures especially tailored for 16-bit DDR SDRAM, and these test fixtures are often purchased by users commonly being memory manufacturers or test houses. However, a complete set of test fixtures is considered quite resource uneconomical for that each costs at least millions of dollars.

SUMMARY OF THE INVENTION

It is therefore an object of the invention to provide an apparatus and a method for testing a semiconductor device, in that a little modification is made to a prior test apparatus and the modified apparatus can then be applied for testing 4-bit, 8-bit and 16-bit I/O semiconductor devices, thereby reducing investment costs of apparatuses and equipments for memory manufacturers and test houses.

To accomplish the aforesaid object, the invention provides a semiconductor device test apparatus for testing a DUT. A test apparatus according to the invention comprises a pair of input pins, with a DUT coupled to one of the input pins; a first conductive wire coupled between the pair of input pins; a second conductive wire coupled between the pair of input pins; a driver coupled to the first conductive wire via a third conductive wire; and a terminator coupled to the second conductive wire via a fourth conductive wire.

The invention also provides a semiconductor device test apparatus for testing a DUT. A test apparatus according to the invention comprises a first I/O pin and a second I/O pin, with a DUT coupled to the first I/O pin; a bus having a plurality of conductive wires, with one of the conductive wires coupled between the first I/O pin and the second I/O pin; a driver coupled to the first I/O pin when under an input mode; a first terminator coupled to the first I/O pin when under an output mode; a comparator coupled to the second I/O pin; and a second terminal coupled to the second I/O pin when under an output mode.

DETAILED DESCRIPTION OF THE PREFERRED EMBODIMENTS

To better understand technical contents of the invention, detailed descriptions of preferred embodiments shall be given with the accompanying drawings below.

Figure 6:
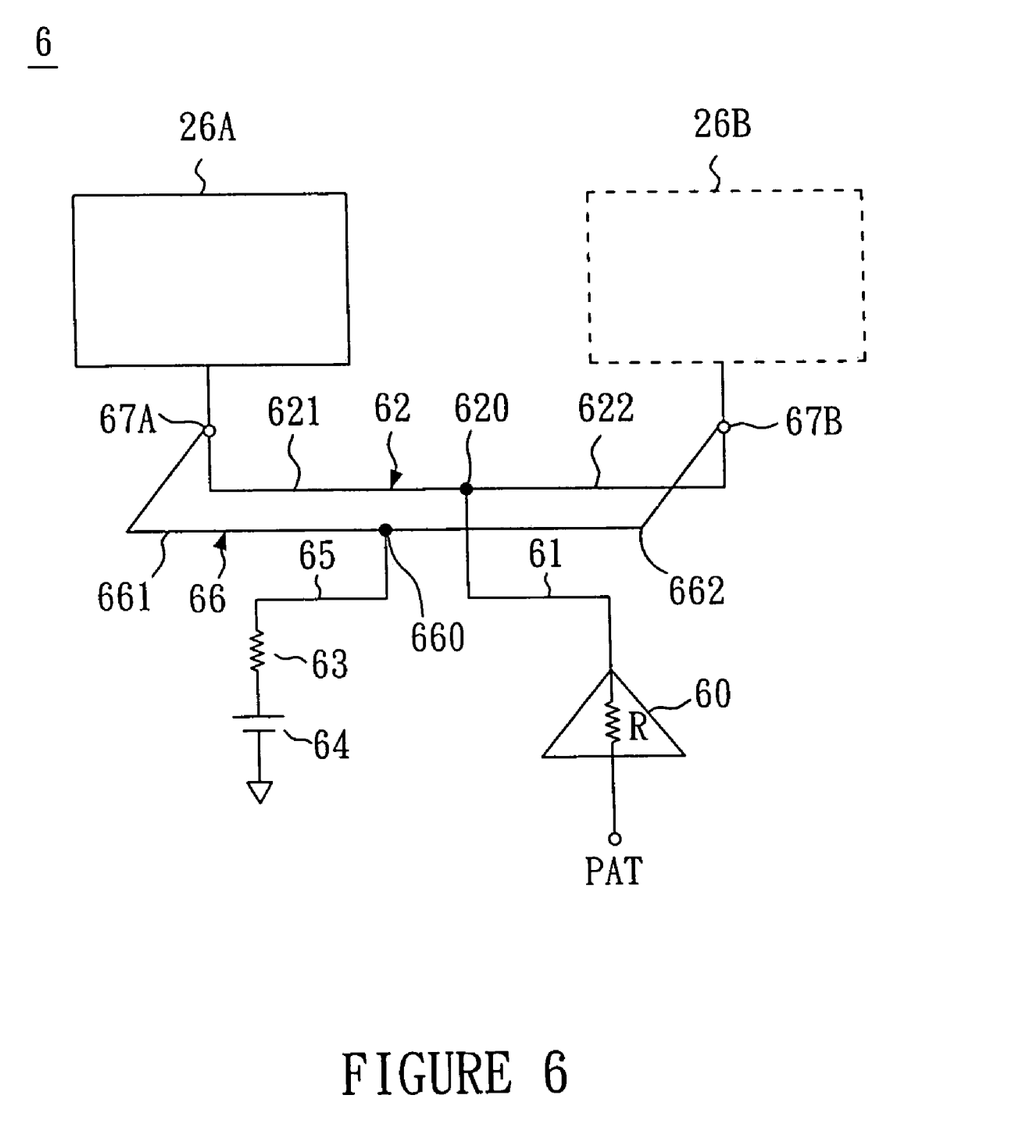
FIG. 6 shows a circuit schematic diagram of a test apparatus according to the invention applied to an input end.

Referring to FIG. 6 showing a circuit schematic diagram of a test apparatus 6 according to the invention applied to an input end, the test apparatus 6 applied to an input end is disposed in the test fixture 16 in FIG. 2. The test apparatus 6 comprises a driver 60, a resistor 63 and a voltage terminal 64. An input end of the driver 60 is for receiving a test pattern signal PAT, and an output end thereof is connected to a conductive wire 62 via a conductive wire 61, with a connecting point of the conductive wires 61 and 62 forming a node 620. The voltage terminal 64 is connected in series between the resistor 63 and ground. The resistor 63 is connected to a conductive wire 66 via a conductive wire 65, with a connecting point of the conductive wires 65 and 66 forming a node 660. The conductive wires 62 and 66 are connected in parallel between input pins 67A and 67B. The conductive wire 62 is distinguished into sub conductive wires 621 and 622 respectively connected to the input pins 67A and 67B. The conductive wire 66 is distinguished into sub conductive wires 661 and 662 also respectively connected to the input pins 67A and 67B. The pin 67A is connected to a certain input end of the DUT 26A, and the pin 67B is connected to a certain input end of the DUT 26B. In other words, the DUTs 26A and 26B are both driven and controlled by the driver 60.

Thus, although output ends of DDR SDRAM are differentiated as 4-bit, 8-bit and 16-bit, the input pins 67A and 67B are respectively inserted into the DUTs 26A and 26B when utilized for 4-bit or 8-bit applications; and the input pin 67A or 67B is left floating and the DUT 26B is removed as in FIG. 6 when utilized for 16-bit applications. In FIG. 6, the conductive wires 62 and 66 are connected in parallel and the voltage terminal 64 is provided, and therefore by appropriately adjusting impedance of the conductive wires 61 and 65 to match the resistance of a resistor 63 with internal resistance R of the driver 60, reflection can be significantly reduced by leaving the input pin 67B floating. Preferably, when the sub conductive wires 621 and 622 have approximately equal lengths while the sub conductive wires 661 and 662 also have approximately equal lengths, propagation delay time may be the same to reduce reflection. Hence, it is preferable that the sub conductive wires 621, 622, 661 and 662 have approximately equal lengths.

Figure 7:
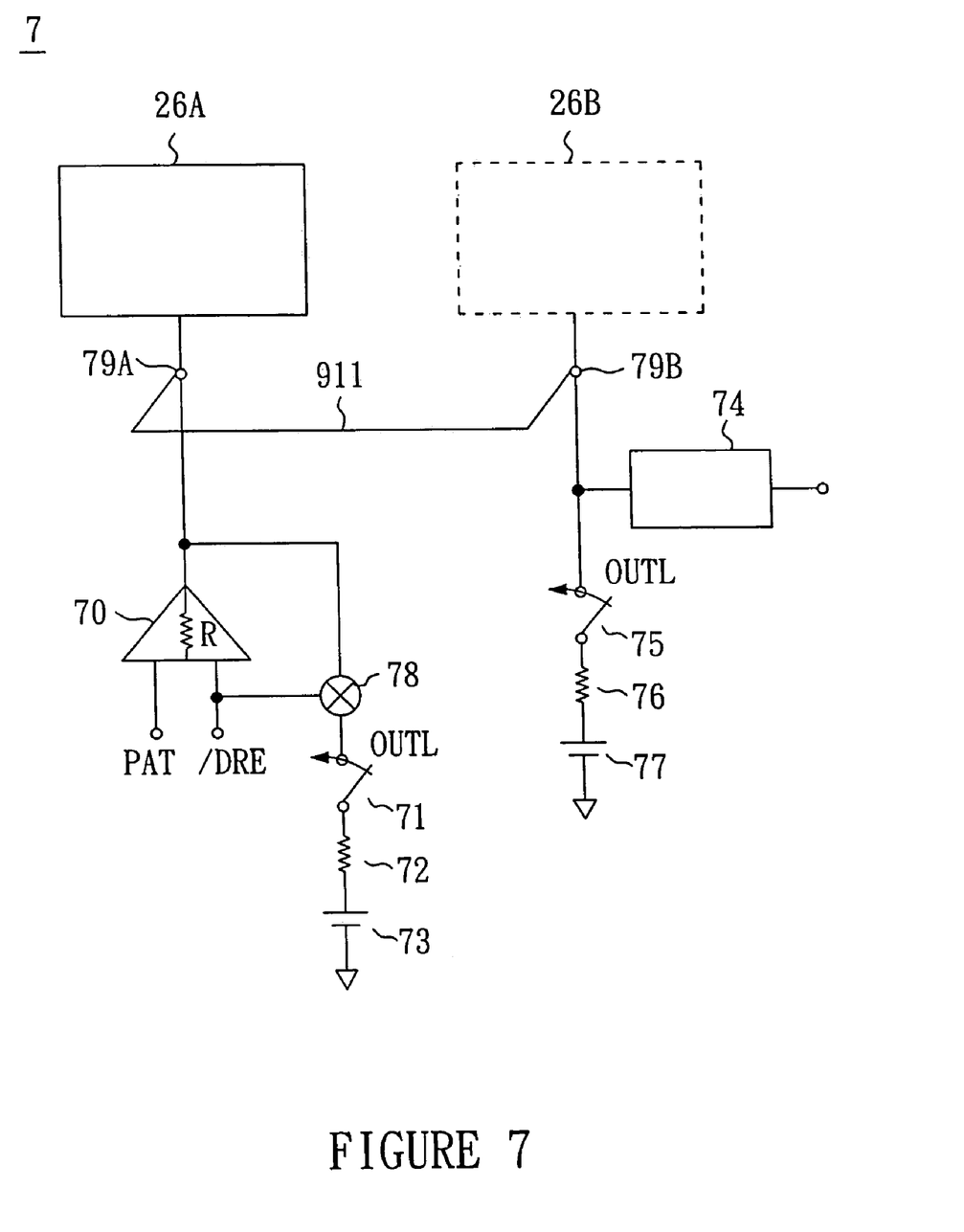
FIG. 7 shows a circuit schematic diagram of a test apparatus according to the invention applied to an I/O end.

FIG. 7 shows a circuit schematic diagram of a test apparatus 7 according to the invention applied to an I/O end and disposed in the test fixture 16 shown in FIG. 2. The test apparatus 7 comprises a driver 70, a switch 71, a resistor 72, a voltage terminal 73, a comparator 74, a switch 75, a resistor 76 and a voltage terminal 77. An input of the driver 70 is for receiving a test pattern PAT, and an output end thereof is connected to the DUT 26A via an I/O pin 79A. The switch 71, the resistor 72 and the voltage terminal 73 are connected in series between a driver enable signal (/DRE) and ground. The comparator 74 is connected to the I/O pin 79B. The switch 75, the resistor 76 and the voltage terminal 77 are connected in series between the comparator 74 and ground. A conductive wire 911 is connected between the I/O pins 79A and 79B. Under a write mode, the switches 71 and 75 are turned off through control of an OUTL signal, and the enable signal /DRE is at logic low for enabling the driver 75, such that the output end of the driver 70 outputs a test pattern signal PAT, with the enable signal /DRE simultaneously disabling the switch 78. Under a read mode, the switches 71 and 75 are turned on through control of an OUTL signal, and the enable signal /DRE is at logic high for disabling the driver 70 and enabling the switch 78, such that the resistor 72 and the voltage terminal 73 are coupled to the I/O pin 79A and the resistor 76 and the voltage terminal 77 are coupled to the I/O pin 79B. The read data whether being logic high or logic low is determined by the comparator 74. According to the invention, the driver 70 the switch 71, the resistor 72 and the voltage terminal 73 are all devised near a side of the I/O pin 79A; and the comparator 74, the switch 75, the resistor 76 and the voltage terminal 77 are devised near a side of the pin 79B. In FIG. 7, the DUT 26B is represented in dotted lines to indicate that the I/O pin 79B is no connection.

Figure 8:
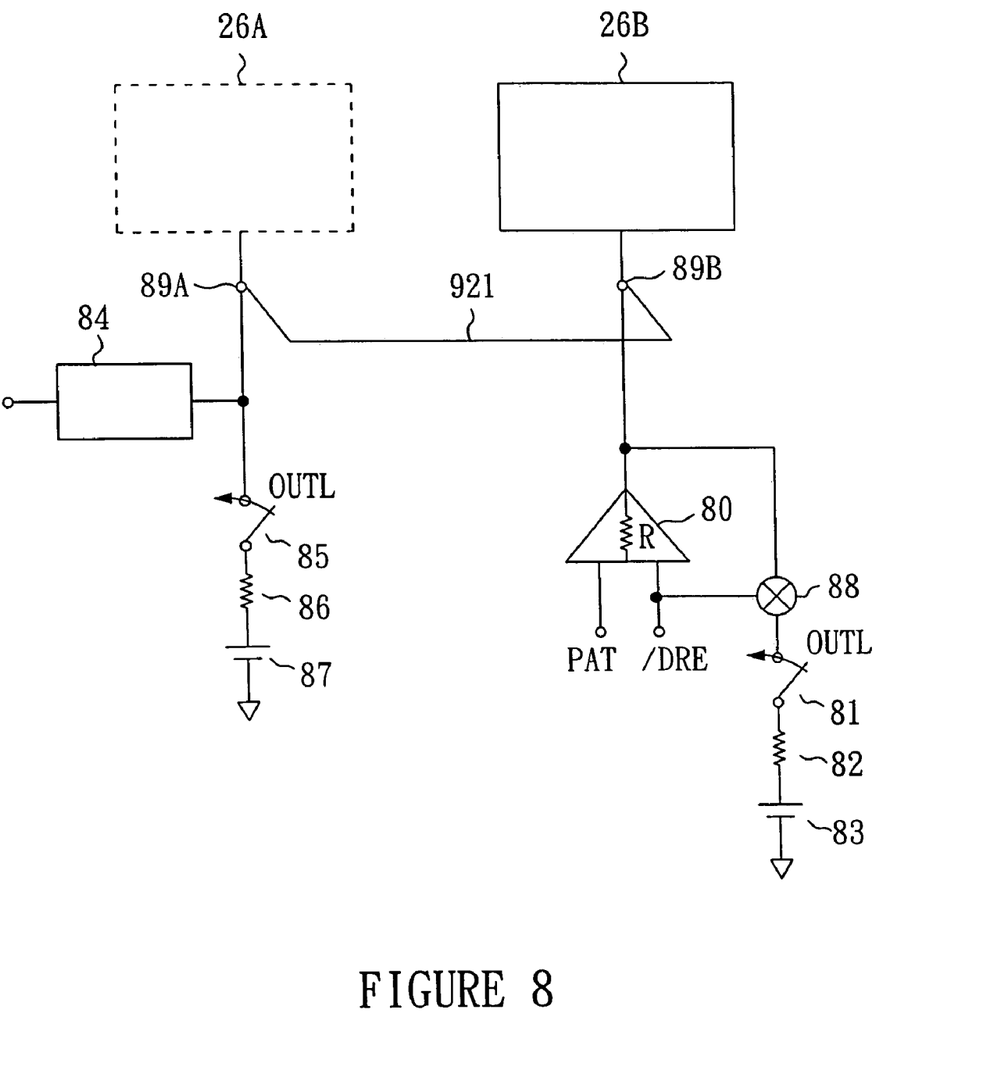
FIG. 8 shows a circuit schematic diagram of a test apparatus according to the invention applied to an input end.

Referring to FIG. 8 showing a circuit schematic diagram of a test apparatus 8 according to the invention applied to an I/O end, the test apparatus 8 applied to an I/O end is disposed in the test fixture 16 shown in FIG. 2. The test apparatus 8 comprises a driver 80, a switch 81, a resistor 82, a voltage terminal 83, a comparator 84, a switch 85, a resistor 86 and a voltage terminal 87. An input of the driver 80 is for receiving a test pattern PAT, and an output end thereof is connected to the DUT 26B via an I/O pin 89B. The switch 81, the resistor 82 and the voltage terminal 83 are connected in series between the driver enable signal /DRE and ground. The comparator 84 is connected to the I/O pin 89A. The switch 85, the resistor 86 and the voltage terminal 87 are connected in series between an input end of the comparator 84 and ground. A conductive wire 921 is connected between the I/O pins 89A and 89B. Under a write mode, the switches 81 and 85 are turned off through control of an OUTL signal, and the enable signal /DRE is at logic low for enabling the driver 80, such that the output end of the driver 80 outputs a test pattern signal PAT, with the enable signal DRE simultaneously disabling the switch 88. Under a read mode, the switches 81 and 85 are turned on through control of an OUTL signal, and enable signal /DRE is at logic high for disabling the driver 80 and enabling the switch 88, such that the resistor 82 and the voltage terminal 83 are coupled to the I/O pin 89A and the resistor 86 and the voltage terminal 87 are coupled to the I/O pin 89B. The read data whether being logic high or logic low is determined by the comparator 84. According to the invention, the driver 80, the switch 81, the resistor 82 and the voltage terminal 83 are devised near a side of the I/O pin 89A; and the comparator 84, the switch 85, the resistor 86 and the voltage terminal 87 are devised near a side of the I/O pin 89B. In FIG. 8, the DUT 26B is represented in dotted lines to indicate that the I/O pin 89A is no connection.

Figure 9:
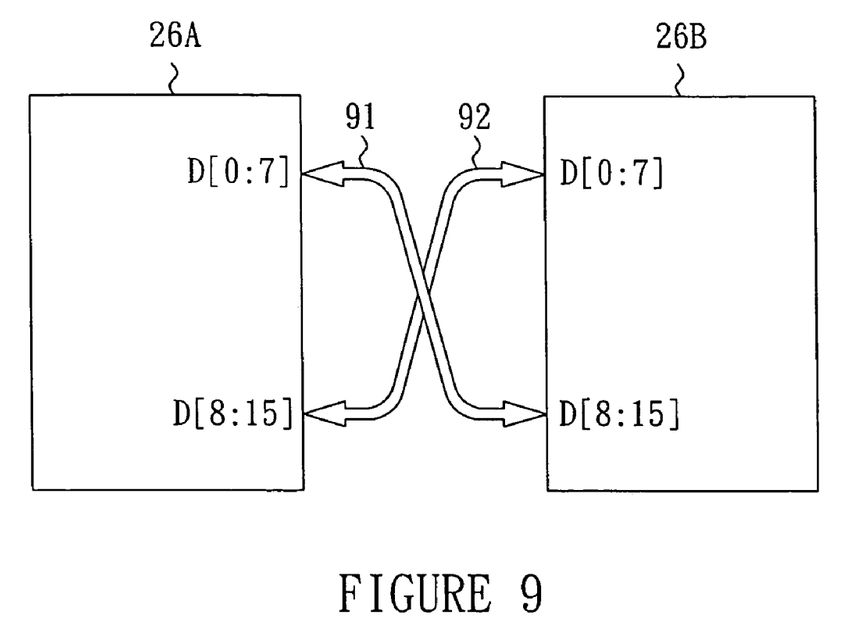
FIG. 9 shows a schematic view illustrating connection configurations of the DUTs in FIGS. 7 and 8.

Referring to FIG. 9 showing connection configurations of the DUTs 26A and 26B in FIGS. 7 and 8, a bus 91 is connected between I/O pins D[0:7] of the DUT 26A and I/O pins D[8:15] of the DUT 26B, and a bus 92 is connected between I/O pins D[8:15] of the DUT 26A and I/O pins D[0:7] of the DUT 26B. To illustrate in detail, I/O pins D0, D1, D2, D3, D4, D5, D6 and D7 of the DUT 26A are respectively connected to I/O pins D8, D9, D10, D11, D12, D13, D14 and D15 of the DUT 26B, and I/O pins D8, D9, D10, D11, D12, D13, D14 and D15 of the DUT 26A are respectively connected to D0, D1, D2, D3, D4, D5, D6 and D7 of the DUT 26B. For instance, the conductive wire 911 in FIG. 7 is among the bus 91 and the pin D0 of the DUT 26A is connected to the pin D8 of the DUT 26B. Supposed the DUTs 26A and 26B are 4-bit or 8-bit, D[8:15] are not connected and therefore the DUT 26B is represented in dotted lines in FIG. 7. Referring to FIG. 8, the conductive wire 921 in FIG. 8 is among the bus 92 and the pin D8 of the DUT 26A is connected to the pin D0 of the DUT 26B. Supposed the DUTs 26A and 26B are 4-bit or 8-bit, D[8:15] are not connected and therefore the DUT 26A is represented in dotted lines in FIG. 8.

Figure 10:
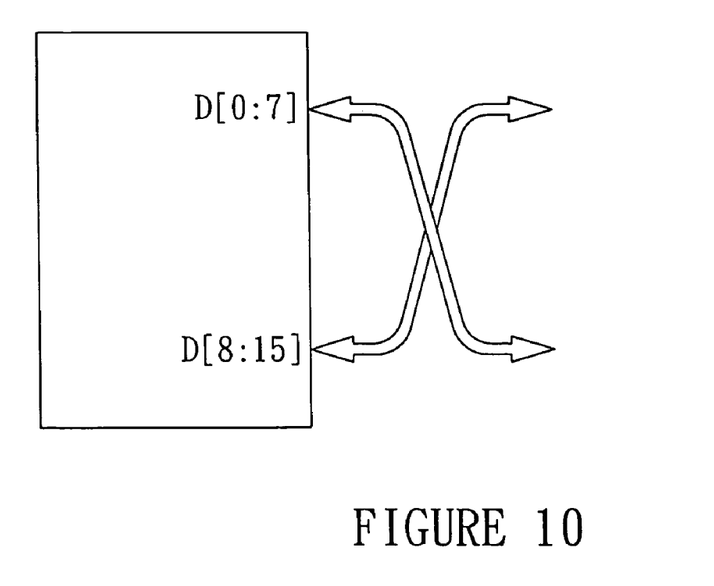
FIG. 10 shows a schematic view illustrating one of the DUTs in FIG. 9 being removed.

Referring to FIG. 10, when the DUTs 26A and 26B are 16-bit, D[8:15] are not no-connection pins, it is necessary that either the DUTs 26A or 26B be removed. FIG. 10 shows the DUT 26B removed for illustration.

From the aforesaid description of the invention, although output end of DDR SDRAM are differentiated in 4-bit, 8-bit and 16-bit, the I/O pins 79A/89A and 79B/89B can be respectively inserted to the DUTs 26A and 26B when utilized for 4-bit or 8-bit applications as shown in FIG. 9; and either the I/O pin 79A/89A or 79B/89B is left floating and the DUT 26B is removed when utilized for 16-bit applications.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A test apparatus for testing a device-under-test (DUT), comprising:
   a pair of input pins, with the DUT coupled to one of said input pins;
   a first conductive wire coupled between said input pins;
   a second conductive wire coupled between said input pins;
   a driver coupled to said first conductive wire via a third conductive wire, wherein a connecting point of said first conductive wire and said third conductive wire forms a first node for distinguishing said first conductive wire into a first sub conductive wire and a second sub conductive wire respectively coupled to said input pins; and
   a terminator coupled to said second conductive wire via a fourth conductive wire.

2. The test apparatus in accordance with claim 1, wherein said third conductive wire and said fourth conductive wire have substantially the same impedance.

3. The test apparatus in accordance with claim 1, wherein said first sub conductive wire and said second sub conductive wire have substantially the same impedance.

4. The test apparatus in accordance with claim 1, wherein a connecting point of said second conductive wire and said fourth conductive wire forms a second node for distinguishing said second conductive wire into a third sub conductive wire and a fourth sub conductive wire respectively coupled to said input pins.

5. The test apparatus in accordance with claim 4, wherein said third sub conductive wire and said fourth sub conductive wire have substantially the same impedance.

6. The test apparatus in accordance with claim 1, wherein said terminator has a resistor and a voltage source connected in series.

7. A test method for testing a device-under-test (DUT), comprising steps of:
   providing a pair of input pins, with the DUT coupled to one of said input pins;
   providing a first conductive wire coupled between said input pins;
   providing a second conductive wire coupled between said input pins;
   providing a driver coupled to said first conductive wire via a third conductive wire, wherein a connecting point of said first conductive wire and said third conductive wire forms a first node for distinguishing said first conductive wire into a first sub conductive wire and a second sub conductive wire respectively coupled to said input pins; and
   providing a terminator coupled to said second conductive wire via a fourth conductive wire.

8. The test method in accordance with claim 7, wherein said third conductive wire and said fourth conductive wire have substantially the same impedance.

9. The test method in accordance with claim 7, wherein said first sub conductive wire and said second sub conductive wire have substantially the same impedance.

10. The test method in accordance with claim 7, wherein a connecting point of said second conductive wire and said fourth conductive wire forms a second node for distinguishing said second conductive wire into a third sub conductive wire and a fourth sub conductive wire respectively coupled to said input pins.

11. The test method in accordance with claim 10, wherein said third sub conductive wire and said fourth sub conductive wire have substantially the same impedance.

12. A test apparatus for testing a device-under-test (DUT), comprising:
   a first I/O pin and a second I/O pin, with the DUT coupled to said first I/O pin;
   a bus having a plurality of conductive wires, one of which is coupled between said first I/O pin and said second I/O pin;
   a driver coupled to said first I/O pin under an input mode;
   a first terminator coupled to said first I/O pin under an output mode;

a comparator coupled to said second I/O pin; and a second terminator coupled to said second I/O pin under said output mode.

13. The test apparatus in accordance with claim 12, further comprising a first switch coupled between said first terminator and said first I/O pin.

14. The test apparatus in accordance with claim 13, wherein said first terminator has a resistor and a voltage source connected in series.

15. The test apparatus in accordance with claim 12, further comprising a second switch coupled between said second terminator and said second I/O pin.

16. The test apparatus in accordance with claim 15, wherein said second terminator has a resistor and a voltage source connected in series.

17. A test method for testing a first DUT and a second DUT, wherein said first DUT has a first effective pin and a first ineffective pin and said second DUT has a second effective pin and a second ineffective pin, the test method comprising the following steps of:

providing a first bus coupled between said first effective pin and said second ineffective pin; and providing a second bus couple between said first ineffective pin and said second effective pin;

wherein, when said first DUT is being tested, said second ineffective pin is left floating; when said second DUT is being test, said first ineffective pin is left floating.

* * * * *